(12) United States Patent
Yuan et al.

(10) Patent No.: US 7,712,027 B2
(45) Date of Patent: May 4, 2010

(54) METHOD FOR DOCUMENT PAGE DELIVERY TO A MOBILE COMMUNICATION DEVICE

(75) Inventors: Jianwei (Oliver) Yuan, Cumming, GA (US); Olav A. Sylthe, Atlanta, GA (US)

(73) Assignee: Research In Motion Limited, Atlanta, GA (US)

(*) Notice: Subject to any disclaimer, the term of this patent is extended or adjusted under 35 U.S.C. 154(b) by 1597 days.

(21) Appl. No.: 10/930,677

(22) Filed: Aug. 31, 2004

(65) Prior Publication Data

US 2006/0047743 A1      Mar. 2, 2006

(51) Int. Cl.
*G06F 17/00* (2006.01)
*G06F 15/16* (2006.01)

(52) U.S. Cl. ............... 715/252; 715/206; 715/251; 715/255; 709/217; 709/218; 709/219

(58) Field of Classification Search ......... 709/217–219; 715/234–253, 273–277
See application file for complete search history.

(56) References Cited

U.S. PATENT DOCUMENTS

| | | | |
|---|---|---|---|
| 6,160,554 A | 12/2000 | Krause | |
| 6,256,666 B1 | 7/2001 | Singhal | |
| 6,300,947 B1 | 10/2001 | Kanevsky | |
| 6,360,252 B1 | 3/2002 | Rudy et al. | |
| 6,438,585 B2 | 8/2002 | Mousseau et al. | |
| 6,546,406 B1 | 4/2003 | DeRose et al. | |
| 6,556,217 B1 * | 4/2003 | Makipaa et al. | 345/667 |
| 6,768,999 B2 | 7/2004 | Prager et al. | |
| 6,895,550 B2 | 5/2005 | Kanchirayappa et al. | |
| 2002/0129277 A1 | 9/2002 | Caccavale | |
| 2002/0161796 A1* | 10/2002 | Sylthe | 707/500 |
| 2003/0023628 A1 | 1/2003 | Girardot et al. | |
| 2003/0236821 A1 | 12/2003 | Jiau | |
| 2004/0133854 A1 | 7/2004 | Black | |
| 2004/0139397 A1 | 7/2004 | Sylthe et al. | |
| 2004/0148571 A1* | 7/2004 | Lue | 715/514 |

(Continued)

FOREIGN PATENT DOCUMENTS

WO        02/44948        6/2002

(Continued)

OTHER PUBLICATIONS

R. Rivest, The MD5 Message-Digest Algorithm, Apr. 1992, IETF RFC 1321.*

(Continued)

*Primary Examiner*—Nathan Flynn
*Assistant Examiner*—Jeong S Park
(74) *Attorney, Agent, or Firm*—Stephen A. Bucchianeri; Brij K. Agarwal; Eckert Seamans Cherin & Mellott, LLC

(57) ABSTRACT

A process for viewing a selected portion of a document on a mobile communication device without having to request multiple pages of the document contents containing document global properties applied to the selected part of the document, comprising marking pages of the document within a server, based on size required by the mobile device, associating properties and attributes of the selected portion with the pages, and transmitting the pages with the properties and attributes for display by the mobile device.

8 Claims, 7 Drawing Sheets

U.S. PATENT DOCUMENTS

| | | | |
|---|---|---|---|
| 2005/0039034 A1 | 2/2005 | Doyle et al. | |
| 2005/0066037 A1 | 3/2005 | Song et al. | |
| 2005/0200610 A1* | 9/2005 | Skantze et al. | 345/173 |
| 2006/0056334 A1* | 3/2006 | Yuan et al. | 370/328 |

FOREIGN PATENT DOCUMENTS

| | | |
|---|---|---|
| WO | 2004/042507 | 5/2004 |

OTHER PUBLICATIONS

"On-Demand Retrieval of Attached File in Mail System", IBM Technical Disclosure Bulletin, IBM Corp., New York, USA, vol. 41, No. 1, Jan. 1998, p. 623, XP000772234, ISSN: 0018-8689.

Borenstein, N et al., "RFC 1521: MIME (Multipurpose Internet Mail Extensions) Part One: Mechanisms for Specifying and Describing the Format of Internet Message Bodies", Network Working Group Request for Comments, XX, XX, Sep. 1993, pp. 1-44, XP002260381.

iGilliot Research. White Paper: "Wireless Access to Email Attachments and Documents", 2001. 16 pages.

M.G. Schultz, E. Eskin, E. Zadok, M. Bhattachryya, S.J. Stolfo: "MEF: Malicious Email Filter—A UNIX Mail Filter that Detects Malicious Windows Executables", Jun. 30, 2001, Proceedings of the Freenix Track: 2001 Usenix Annual Technical Conference, Boston, Mass., USA XP002300865.

Rodriguez et al, "IBM Redbooks: New Capabilities in IBM WebSphere Transcoding Publisher Version 3.5 Extending Web Applications to the Pervasive World", May 2001.

* cited by examiner

METHOD FOR DOCUMENT PAGE DELIVERY TO A MOBILE COMMUNICATION DEVICE

FIELD OF THE INVENTION

The following is directed in general to displaying content on mobile communication devices, and more particularly to a method for viewing a selected portion of a document on a mobile communication device without having to request multiple pages of the document contents containing document global properties applied to the selected part of the document.

BACKGROUND OF THE INVENTION

Mobile communication devices are becoming increasingly popular for business and personal use due to a relatively recent increase in number of services and features that the devices and mobile infrastructures support. Handheld mobile communication devices, sometimes referred to as mobile stations, are essentially portable computers having wireless capability, and come in various forms. These include Personal Digital Assistants (PDA), cellular phones and smart phones. While their reduced size is an advantage to portability, bandwidth and processing constraints of such devices present challenges to the downloading and viewing of documents, such as word processing documents, tables and images.

Electronic documents are produced using various computer programs, such as word processors, spreadsheet programs, financial software, and presentation software. In addition to text, such documents contain structural and property information such as paragraph indentation, text color and table size, etc.

When a user of a mobile communication device wishes to view only selected portions of a document stored on a remote server, other portions of the document that contain the structural information and properties used by the selected portion must also typically be transmitted to the mobile communication device. The required downloading of these other portions occurs over a potentially bandwidth-constrained wireless network. For example, if a user wishes to view only a single paragraph in a section at the middle of a 400-page document, the entire section (and sometimes even entire document) that contains default properties for the paragraph must be transmitted to the mobile communication device.

Once downloaded to the device, the electronic document is viewed using a user interface on the mobile communication device, which typically differs from the user interface used to create and view a document on a personal computer. For example, whereas the user interface on a personal computer may include a large, color display and a pointing device such as a mouse, the mobile communication device typically has only a small, possibly non-color, screen, and may not have a mouse. In addition, the mobile communication device typically has greater processing power and memory limitations than a personal computer.

SUMMARY OF THE INVENTION

According to an aspect of the invention, a method is provided for viewing a selected portion (page) of a document on a mobile communication device without having to retrieve the full document onto the device. In one embodiment, a server pagination function is used for marking pages of a document based on size required by a mobile communication device. According to another aspect of the invention, document pages are generated and transmitted by the server to the mobile device in such a way as to associate all of the required properties and attributes for the selected portion (page).

By using this approach for page delivery from the server, the client on the mobile device is able to retrieve any portion (page) of a document and display it independently, since all of its properties and attributes are already associated. This eliminates the order dependence for displaying a document such as required by a desktop application. More importantly, overall network bandwidth usage is limited.

Additional aspects and advantages will be apparent to a person of ordinary skill in the art, residing in the details of construction and operation as more fully hereinafter described and claimed, reference being had to the accompanying drawings.

BRIEF DESCRIPTION OF THE DRAWINGS

A detailed description of the preferred embodiment is set forth in detail below, with reference to the following drawings, in which.

DETAILED DESCRIPTION OF THE PREFERRED EMBODIMENT

Figure 1:
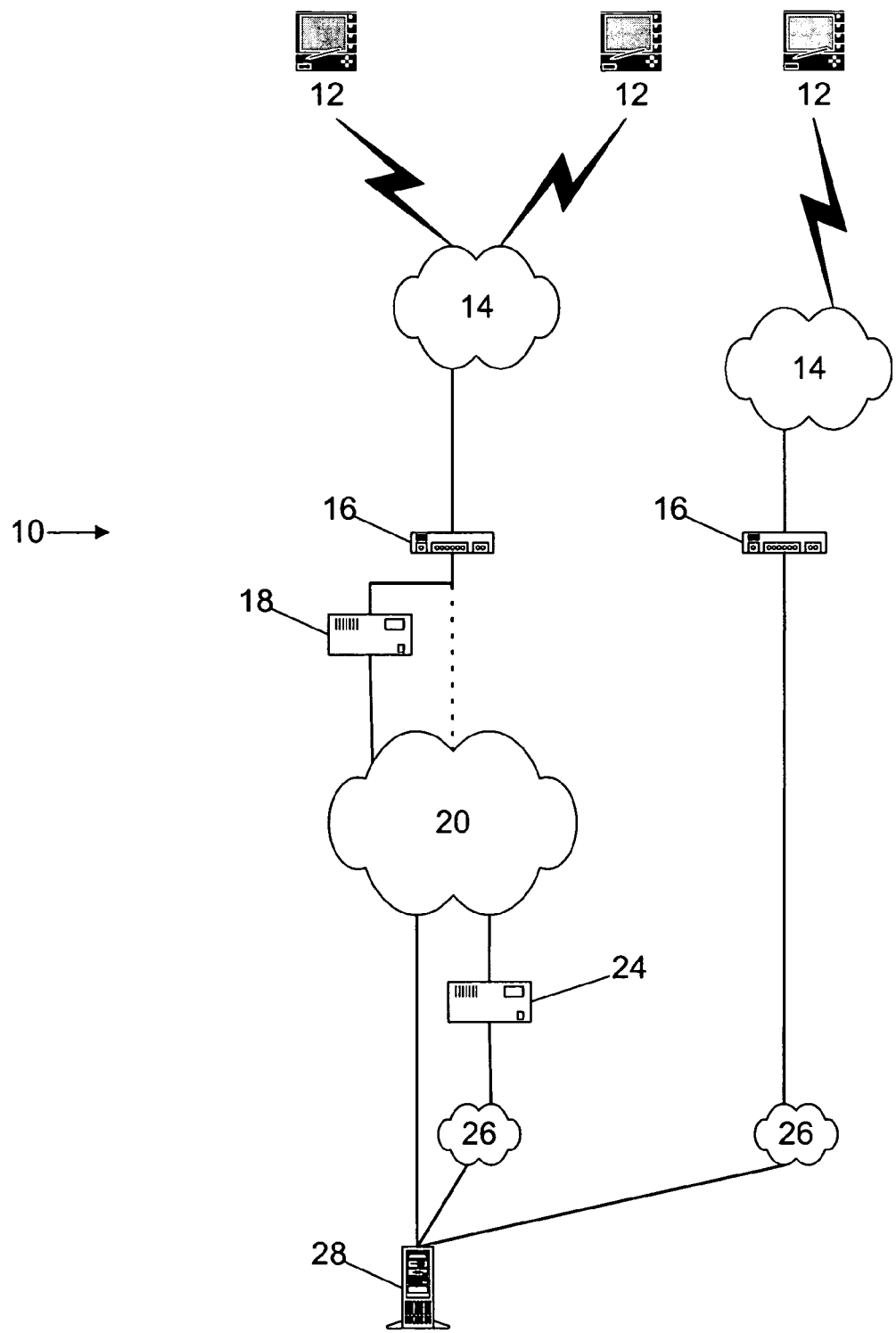
FIG. 1 is a block diagram of a network environment in which the preferred embodiment may be practiced.

With reference to FIG. 1, network environment 10 is shown in which the preferred embodiment of the invention may be practiced. Network environment 10 includes mobile devices 12 communicating via a wireless network 14 to a server 28 for downloading document attachments to the mobile devices 12. While only one server 28 is shown for illustration purposes, a person of skill in the art will understand that network environment 10 could have many such servers for hosting web sites or graphic download sites, providing access to picture files such as JPEG, TIFF, BMP, PNG, SGI, MP4, MOV, GIF, SVG, etc. As would be understood by one of ordinary skill in the art, wireless networks 14 include GSM/GPRS, CDPD, TDMA, iDEN Mobitex, DataTAC networks, or future networks such as EDGE or UMTS, and broadband networks like Bluetooth and variants of 802.11.

A connection to a fixed service requires special considerations, and may require special permission as authorized through a Network Access Point (NAP) 16. For generic services, such as web access, a proxy-gateway or Network Address Translator (NAT) 18 may be provided so that a network operator can control and bill for the access. NATs 18 enable management of a limited supply of public Internet addresses for large populations of wireless mobile devices. Solutions offered by a proxy-gateway or NAT 18 can require a complex infrastructure and thus may be managed by a value-added service providers (VASPs), which provide, for instance, WAP gateways, WAP proxy gateway solutions, multi-media messaging servers (MMS) and Internet Multi-Media Services (IMS).

Private Intranet services 26 also connected to Internet 20 may require their own Private Intranet Proxy Gateway 24 for accessing content on server 28. Such private services include WML access to corporate mail systems, HTML access to CRM databases, or any other services that deliver information as formatted data with links and URLs embedded. As shown, it is possible that a private service 26 may be connected directly to wireless network 14, as opposed to connected via Internet 20.

Referred to throughout this document for the purpose of describing the preferred embodiment is the structure of a Document Object Model (DOM) for a document attachment to be viewed on a mobile device 12.

The attachment server 28 uses a designated file-parsing distiller for a specific document type to build an in-memory Document Object Model (DOM) structure representing an attachment of that document type. The document DOM structure is stored in a memory cache of server 28, and can be iterated bi-directionally.

Figure 2:
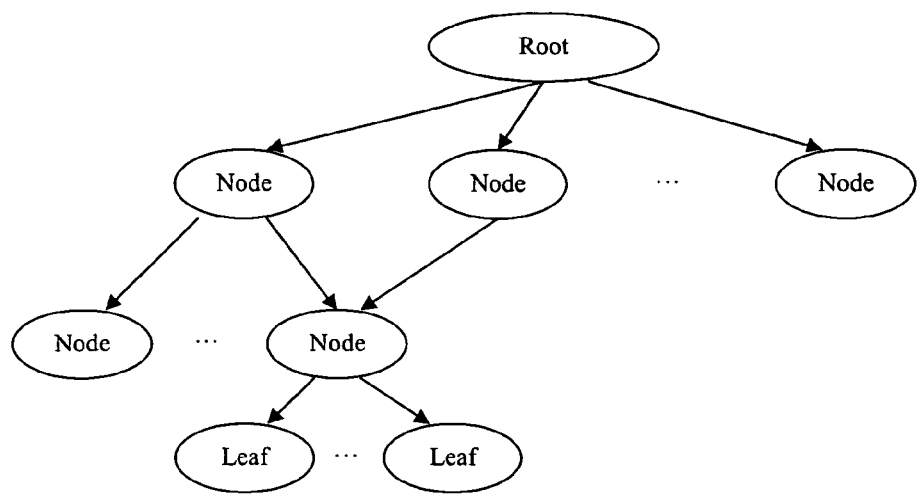
FIG. 2 is a tree diagram showing the basic structure of a Document Object Model (DOM) used in the preferred embodiment of the invention.

As shown in FIG. 2, the graph-based document DOM structure consists of nodes and leaves. The nodes serve as the parents of leaves and nodes, while leaves are end points of a branch in the graph. Each node and leaf can have a set of attributes to specify its own characteristics. For example, a paragraph node can contain attributes to specify its alignment, style, entry of document TOC, etc. In addition, each of the nodes and the leaves has a unique identifier, called a DOM ID, to identify itself in the document DOM structure.

The document DOM structure is divided into three parts: top-level, component and references. The top level refers to the document root structure, while the main document is constructed in the component and the references represent document references to either internal or external sub-document parts. The following paragraphs examine each part in detail.

Figure 3:
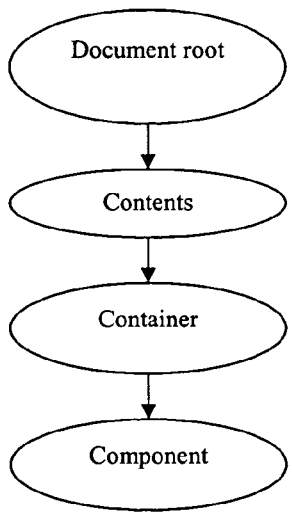
FIG. 3 shows the top-level of the DOM structure in FIG. 2.

The root node of a document DOM structure, referred to as "Document", contains several children nodes, referred to as "Contents", which represent different aspects of the document contents. Each "Contents" node contains one or multiple "Container" nodes used to store various document global attributes. The children of the "Container" nodes are components, which store the document structural and navigational information. When the attachment server 28 builds the DOM structure for an attachment file for the first time, the top-level structure is a single parent-child chain as shown in FIG. 3:

Three types of components are defined by the attachment server 28: text components, table components and image components, which represent text, tables and images in a document, respectively. The text and table components are described in detail below, and the image component structure is identical.

A component consists of a hierarchy of command nodes. Each command represents a physical entity, a property, or a reference defined in a document. For the text component, the physical entity commands are page, section, paragraph, text segments, comments, footnote and endnote commands, which by name define the corresponding entity contained in a document. The property commands for the text component are font, text color, text background color, hyperlink start/end and bookmark commands. The text component has only one reference command, referred to as the text reference command, which is used to reference a subdocument defined in the main body of a document. Usually, the children of a text component are page or section command nodes that, in turn, comprise a set of paragraph command nodes. The paragraph command can contain one or multiple nodes for the remaining command types.

Figure 4:
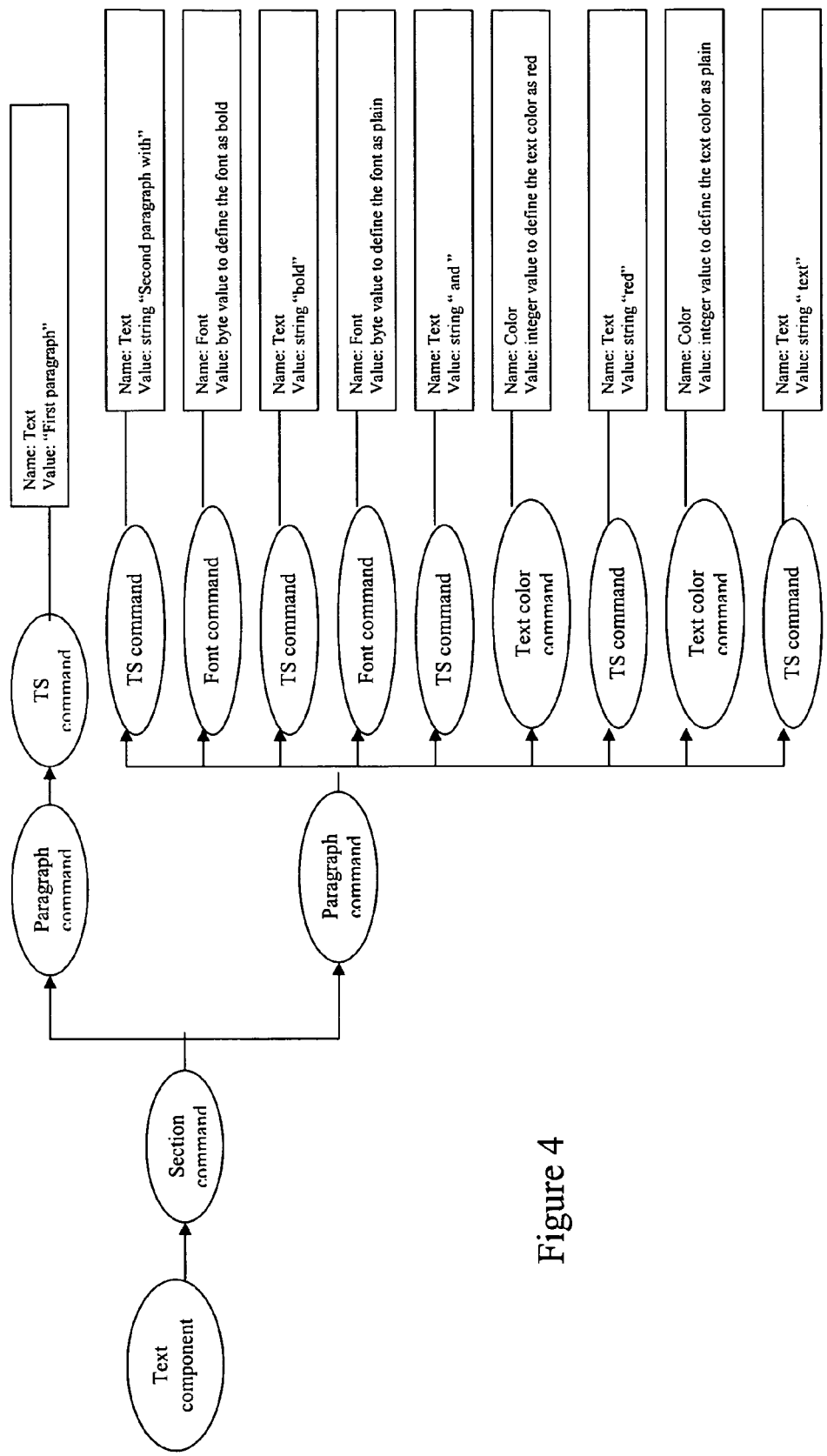
FIG. 4 shows an exemplary DOM structure for a word processing document.

Using the following sample text document, the corresponding document DOM structure is shown in FIG. 4:

First paragraph.
Second paragraph with bold and red text.

As FIG. 4 demonstrates, the section command, which is the child of the text component, consists of two paragraph commands. The first paragraph command contains one text segment command and the text content for that paragraph is added as an attribute to the text segment command. The second paragraph command has a relatively more complex structure, as the text properties in the paragraph are much richer. Each time a text property (font, text color, etc) changes, a corresponding text property command is created and the change value is added to that command as an attribute. The following text segment command records the text with the same text property as an attribute. As document structure gets richer and more complex, more commands of corresponding types are created and the document properties are added as attributes to those commands.

The table component has the same three types of commands as the text component, but different command names. The document DOM structure for the sample table document below is shown in FIG. 5:

| Cell One | Cell Two |
|----------|----------|
| Cell Three | Cell Four |

Figure 5:
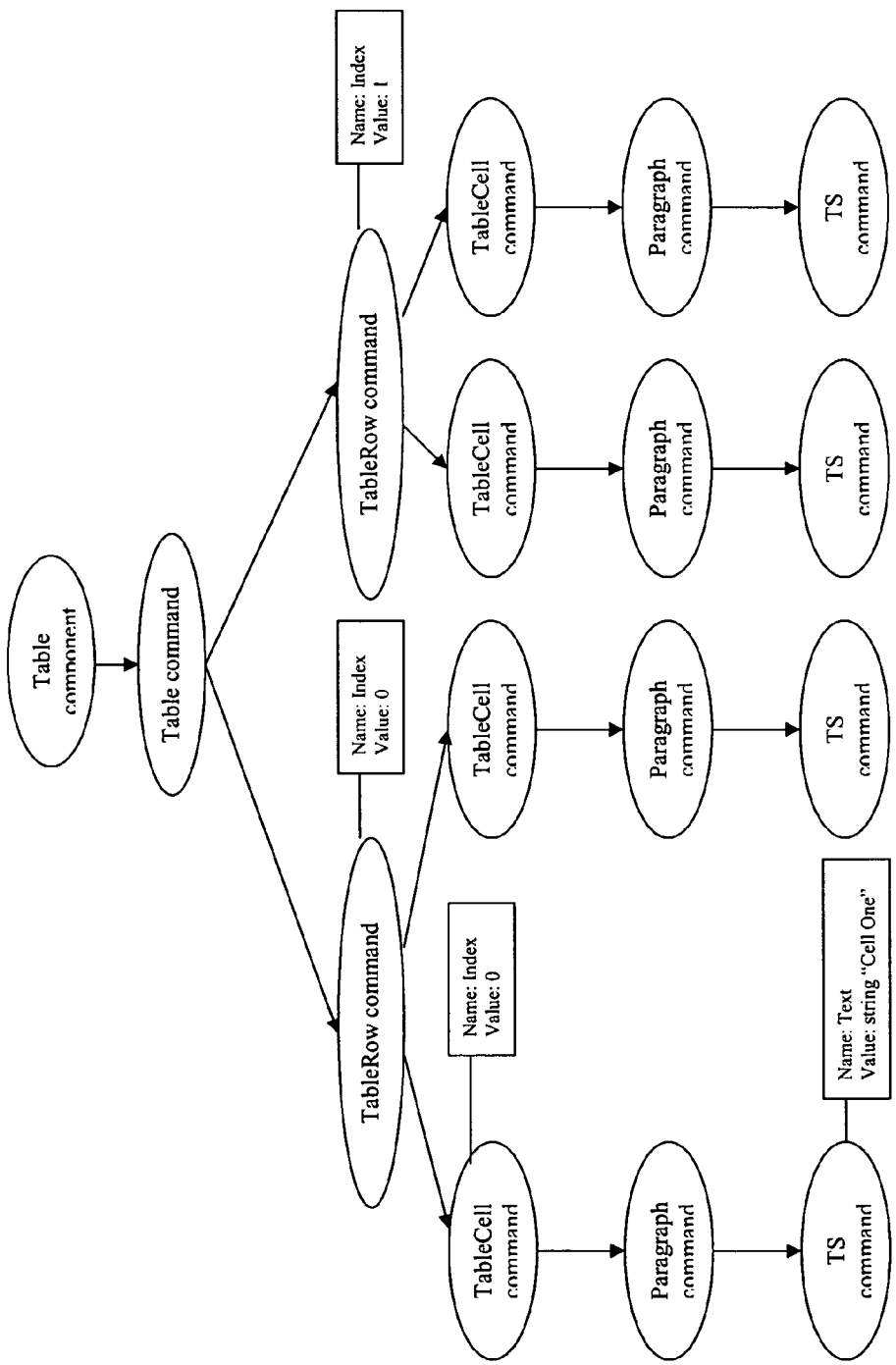
FIG. 5 shows an exemplary DOM structure for a table document.

As shown in the FIG. 5, the table component has physical entity type commands of table, tablerow and tablecell, where the tablecell command can contain all available commands for the text component. In the example above, the first child TableRow command of the table command has an attribute "Index" defined by value of 0. This indicates that the indicated table row is the first one defined in the table. The attribute of the leftmost table cell command in FIG. 5 has the same meaning.

A document sometimes contains subdocuments, for example images, tables, text boxes etc. The DOM structure set forth herein uses a reference command to point to the graph of such subdocuments. Thus, for the following sample document, the attachment server 28 generates the DOM structure shown in FIG. 6:

This document has subdocument of images like this one.
Second paragraph contains the same image.

Figure 6:
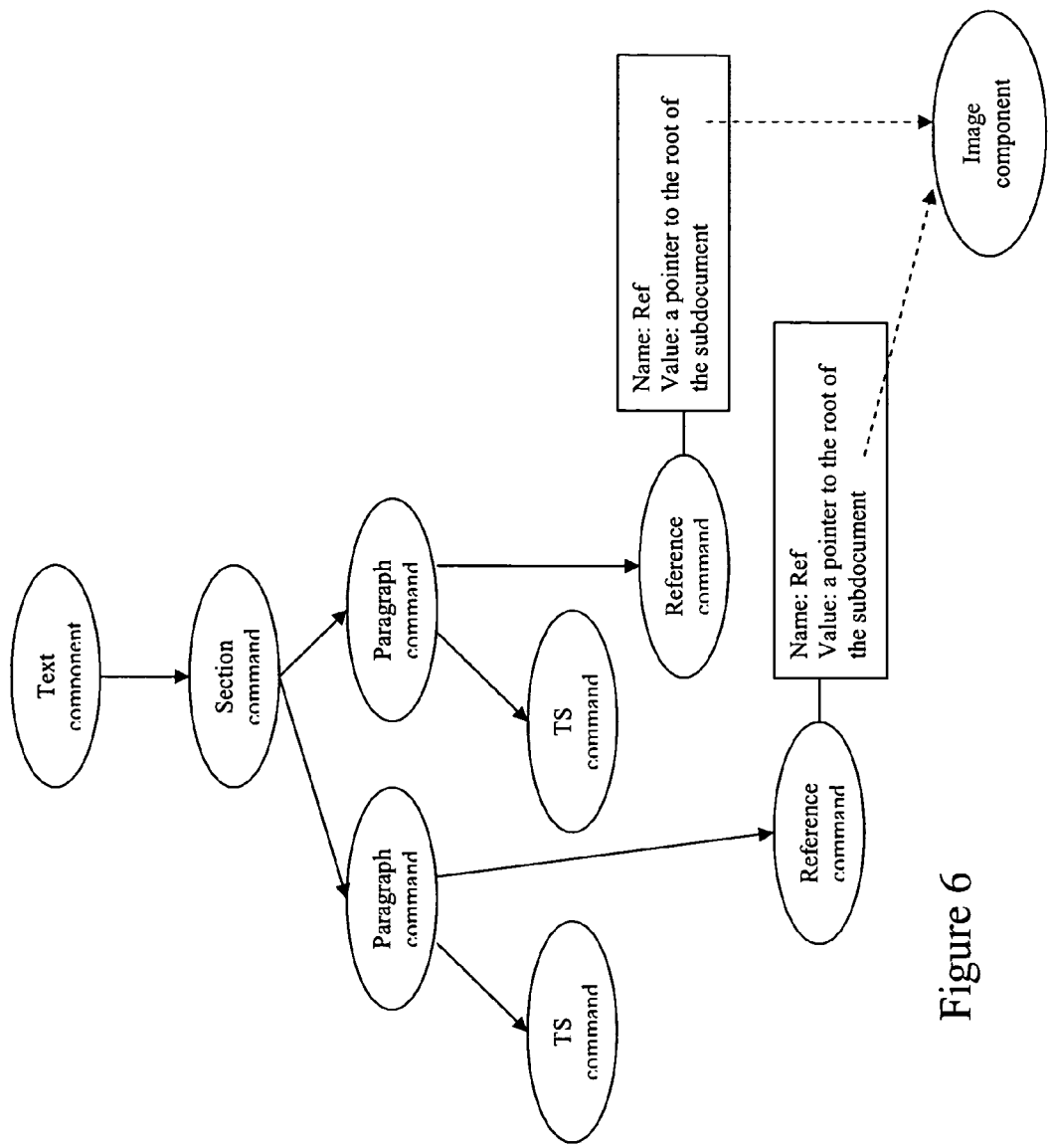
FIG. 6 shows an exemplary DOM structure for a word processing document containing an image subdocument.

The structure shown in FIG. 6 is identical to that discussed above in connection with FIGS. 4 and 5, except for the attributes of the two reference commands. The attachment server 28 constructs the image in "Sample Three" as a separate image component, which contains all of the image data in its own DOM hierarchy. In the DOM structure for the main document, the values of the "Ref" attributes of those two reference commands point to the image component, as indicated by the dashed lines, such that the DOM structure connects together all parts of the document.

Having described the document DOM structure used to implement an embodiment of the invention, a detailed discussion will now be provided of a pagination function or method according to the preferred embodiment.

Figure 7:
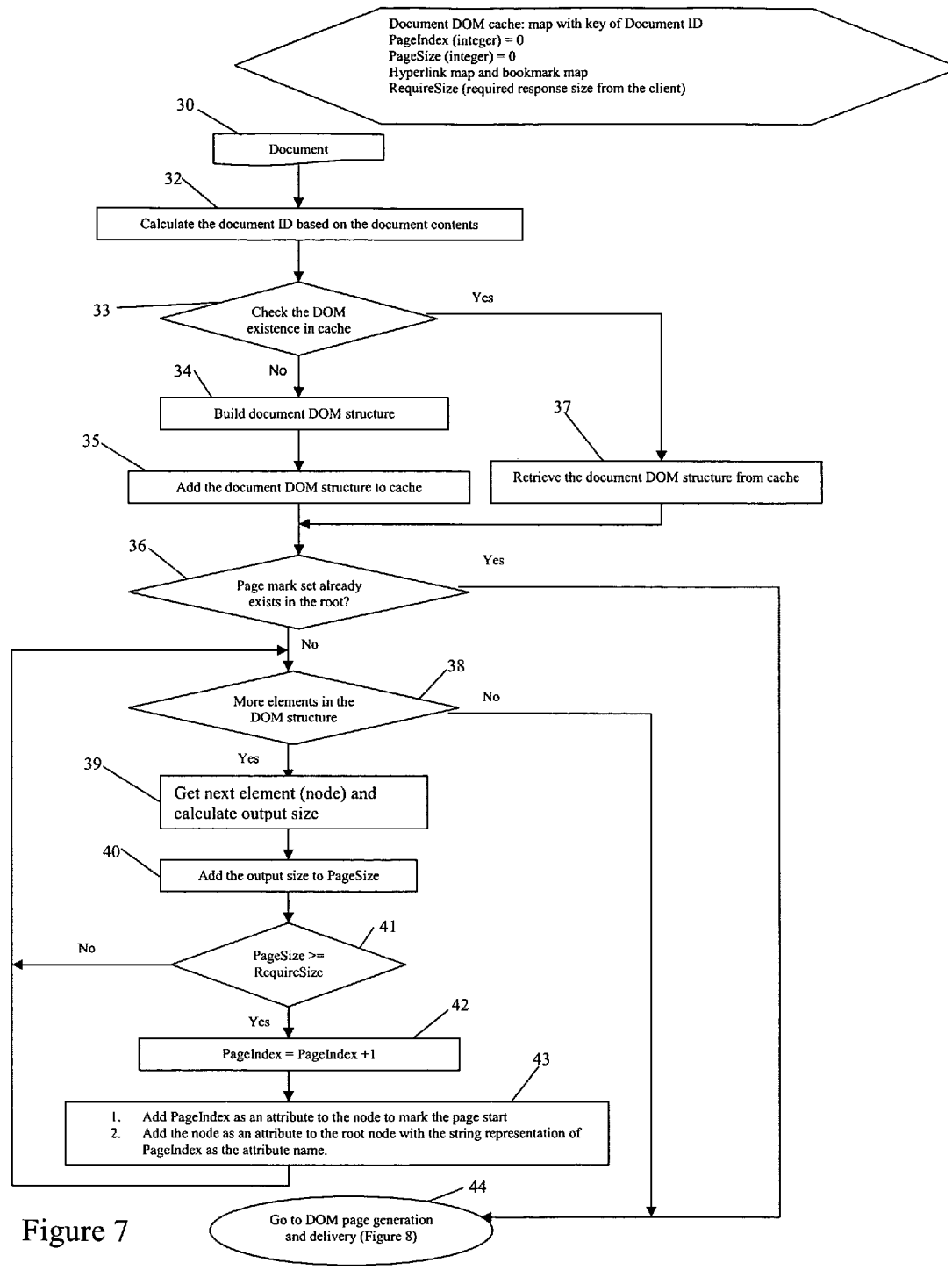
FIG. 7 is a flowchart showing document DOM structure construction and pagination according to the preferred embodiment.

The pagination function is a client and server side operation. FIG. 7 shows the processing steps, from which it will be noted that the server 28 uses a map in memory for document DOM cache storage and the key to the map is the document ID. Initially, when the user of a mobile communication device 12 sends a request to the server 28 to view a document, the device 12 sends two attributes and the number of bytes it requires (RequireSize) as a response from the server (e.g. 3K bytes). The two attributes are whether the device is a color or monochrome device, and the screen size (width×height× color depth) of the device in pixels. Other information about the device 12 can also be transmitted to the server 28 (e.g. memory size). After the server 28 receives a document-viewing request, it starts the pagination process (step 30), and initializes the variables PageIndex and PageSize.

The following terms and variables are used in the process of FIG. 7:

The PageIndex variable is defined in the server 28 and used by the server to record the current page index being paginated by the server. The page index is initially set to 0 indicating "Page 1".

PageSize is a variable defined in the server 28 and used by the server to record the current size for the page being paginated and is reset to 0 when paginating a new page.

Hyperlink map is a variable defined in the server 28, which is a container consisting of the element type of hyperlink node in the document DOM structure. The key (ID) for each element in the container is the hyperlink target string.

Bookmark map is a variable defined in the server 28 which is a container consisting of the element type of current page index (PageIndex value) for the bookmark in the document DOM structure. The key (ID) for each element in the container is the bookmark string.

The server process constructs a document ID (step 32) based on the document contents and uses the ID to check the document DOM cache (step 33) to determine whether the document DOM structure for that document has been constructed. If the document DOM structure does not exist in the cache, the server builds the DOM structure (step 34) for the document and adds it to the cache (step 35).

To construct the document ID, the original document file is opened and read in binary mode. The server 28 creates a MD5 Context structure, hashes the MD5 context structure with raw binary data, byte-by-byte, from the file, finalizes the MD5 context structure and retrieves the 16 byte key for the file. The MD5 context structure has the following structure in syntax of C++ language

```
typedef struct
{
    unsigned long   adwState[4];    /* state (ABCD) */
    unsigned long   adwCount[2];    /* number of bits, modulo 2^64 (lsb first) */
    unsigned char   abyBuffer[64];  /* input buffer */
} tMD5_CTX;
```

Caching the document DOM structure requires considerable memory, and therefore increases the overall hardware deployment cost. On the other hand, building the DOM structure for a document is even more time and CPU intensive in contrast to the document key construction operation, especially for big documents. Since processing time is more critical than hardware deployment cost for wireless operation, caching the document DOM is the approach adopted for the preferred embodiment, rather than building the DOM structure for the document each time the server receives a viewing request and then discarding the structure after sending the response back to the client device 12.

Once the document DOM structure has been built and stored in the cache, the server 28 determines whether a page mark has already been set in the root (step 36). If not, the server traverses through the DOM structure (steps 38, 39, 40 and 41) and calculates the output size (PageSize) for each node in the DOM structure based on the number of bytes (RequireSize) provided by the device 12. The server increments the PageIndex (step 42), adds it as an attribute to each node in order to mark the start of each page, and adds each node as an attribute to the root node with the string representation of PageIndex as the attribute name (step 43). Following this pagination function, the attachment server 28 is able to transmit the document page-by-page to the requesting mobile device 12 based on client generated requests, and process flow continues to FIG. 8 for DOM page generation and delivery (step 44).

The page mark attribute name is associated with the device information and required response size (RequireSize) provided by the device 12, to enable the server to paginate through the document DOM structure and generate the response based on device capability. For example if the device is a monochrome type, the color information contained inside the DOM structure will be ignored during the server pagination and response generation operations and therefore optimize the wireless bandwidth utilization.

Since the key to the memory map is the document ID, the algorithm used to calculate the document ID (step 32) must guarantee the uniqueness of the key. According to the best mode, as set forth above, the algorithm used inside the server 28 is the MD5 messaging encryption algorithm invented by Professor Ronald L. Rivest of MIT Laboratory for Computer Science and RSA Data Security, Inc. There are several other hashing options that can be used. However MD5 is the most efficient and reliable one based on the broad range of different document content required to be processed by the server 28.

Figure 8:
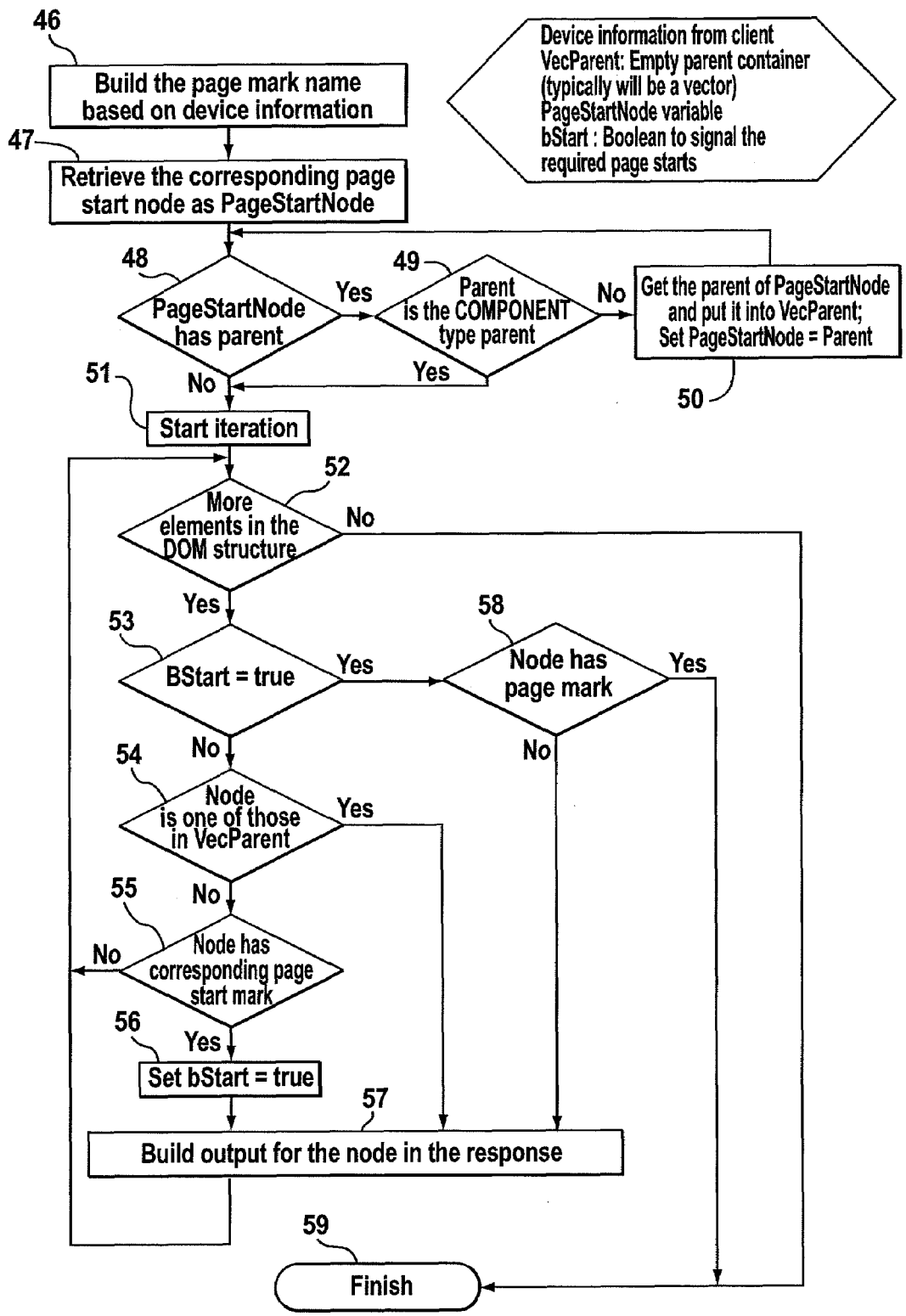
FIG. 8 is a flowchart showing document DOM page generation and delivery according to the preferred embodiment.

In the process of FIG. 8, PageStartNode is DOM structure node type which, in the preferred embodiment is a COM (Common object module) object base interface. VecParent is typically a one-dimensional container, for example vector, containing elements of DOM structure node type. It is used to store the parents (recursively until the node of component type) for the page-starting node, as discussed in greater detail below. bStart is a Boolean variable defined in the server 28 and used to signal that the required page has already been been traversed.

In operation, the server 28 uses PageIndex to build the page mark attribute (step 46) and search for the node representing the page start (step 47) for the page of interest identified by the client device 12. It is used by the server 28 to cache the node which marks the start for the page required by the client device 12. Once the node is found, the server 28 recursively retrieves the parent of the node (step 48) until it reaches the component level (step 49) and puts all the parents into storage (VecParent), namely the parent container (step 50). The server 28 then traverses the DOM structure again (steps 51 et seq) to persist the in-memory structure to a form that can be transmitted across the network to the mobile device 12. If a node is one of those stored in the parent container (step 54), it generates the output for the node (step 57). The output includes the contents and attributes for all of the nodes/leaves belonging to that page as well as the attributes of the parents for the page start node.

Upon locating the corresponding page start node (step 55), the server 28 sets a Boolean (bStart) to true, indicating that the page has been traversed (step 56), and generates the output (step 57) for each following node to be iterated until the next page mark is found (step 58). Once the server 28 determines that it has completed traversing the DOM structure (step 52), or has found the next page start mark (step 58), the process finishes (step 59).

From FIG. 8, it will be noted that all of the parents for the page-start node are output into the response, which means the default attributes and properties defined for the node but contained in its parents, will persist. However, the siblings of the node are ignored if they do not belong to the response page. For example, if the client (mobile device 12) requires the second part for a spreadsheet, the server 28 not only generates the response containing the corresponding text contents but also includes the global information for the table such as number of rows and columns and current table row and cell index, etc., into the response. Once the client receives the response, it can display the text at the correct position without having to request the first part of the spreadsheet from the server.

A person skilled in the art, having read this description of the preferred embodiment, may conceive of variations and alternative embodiments. For example, generating multiple sets of page marks for successive pages requires considerable time and CPU usage since the server 28 has to re-traverse the DOM structure. Accordingly, one alternative is for the server 28 to create only one set of page marks in a document DOM structure and generate the response based on the device information. However, this approach is likely to create more page marks than necessary and will introduce extra transactions between the wireless device 12 and the server 28 if the user wants to view a large portion of a document. Based on the understanding that minimizing the wireless bandwidth usage is more critical than the processing time on the server, creating multiple sets of the page marks and caching them is the approach adopted in the preferred embodiment.

All such variations and alternative embodiments are believed to be within the ambit of the claims appended hereto.

What is claimed is:

1. A process for viewing a selected portion of a server stored document on a mobile device, comprising:

building a graph structure within said server representing a map of said document;

marking pages of the document within said server based on size required by said mobile device, wherein said marking pages further comprises transmitting a page size limit from said mobile device to said server indicative of the size of a single page of said document to be displayed by said mobile device, traversing and paginating said graph structure into successive pages within said server based on said page size limit, and caching said pages within said server;

associating properties and attributes of said selected portion with ones of said pages containing said selected portion; and transmitting said ones of said pages containing said selected portion with said properties and attributes for display by said mobile device independently of other pages of said document;

wherein said associating properties and attributes further comprises searching said graph structure for a node representing a page start for said selected portion of said document;

traversing said graph structure and recursively storing each parent of said node representing the page start in a parent container within said server, such that said parent container contains all nodes and leaves belonging to said page start and each parent of said node;

generating an output for each said page start containing contents and attributes of all said nodes and leaves belonging to said page start and attributes of each parent of said node representing the page start, for transmission to said mobile devices; and calculating a document ID based on contents of said document before building said graph structure, checking a memory cache of said server using said document ID for said graph having been previously built, and in the event said graph structure exists in the memory cache then omitting the building of said graph structure.

2. The process of claim 1, wherein traversing and paginating said graph structure further comprises:

initializing a page size value;

retrieving and calculating output size of successive nodes of the graph structure; adding the output size of said successive nodes to said page size value; and in the event said page size value exceeds said page size limit for a given node then marking said graph structure to identify said given node as starting a new page for transmission to said mobile device.

3. The process of claim 2, wherein marking said graph structure further comprises:

maintaining a page index value that is incremented with each new page; adding said page index value as an attribute to each said given node for marking each said new page; and adding each said given node as an attribute to a root node of said graph structure with a string representation of said page index value as attribute name.

4. The process of claim 1, wherein calculating said document ID further comprises performing a hashing function on the contents of said document and in response generating said document ID as a unique key to said map.

5. The process of claim 4, wherein said hashing function comprises the MD5 messaging encryption algorithm.

6. The process of claim 1, wherein said graph structure is a Document Object Model (DOM).

7. The process of claim 1, wherein said traversing said graph structure and recursively storing each parent of said node representing the page start in said parent container persists until a node of component type is reached.

8. The process of claim 7, wherein said generating an output for each said page start persists until a further page start is located.

* * * * *

UNITED STATES PATENT AND TRADEMARK OFFICE
CERTIFICATE OF CORRECTION

PATENT NO. : 7,712,027 B2  
APPLICATION NO. : 10/930677  
DATED : May 4, 2010  
INVENTOR(S) : Yuan et al.

Page 1 of 1

It is certified that error appears in the above-identified patent and that said Letters Patent is hereby corrected as shown below:

On the Title Page, please correct "Atlanta, GA (US)" to "Waterloo, ON (CA)" at Item (73), to read as follows:

(73)     Assignee: Research In Motion Limited, Waterloo, ON (CA)

Signed and Sealed this  
Sixteenth Day of October, 2012

David J. Kappos  
*Director of the United States Patent and Trademark Office*